United States Patent
Chen et al.

(10) Patent No.: US 11,527,499 B2
(45) Date of Patent: Dec. 13, 2022

(54) INTEGRATED FAN-OUT STRUCTURES AND METHODS FOR FORMING THE SAME

(71) Applicant: Taiwan Semiconductor Manufacturing Company Limited, Hsinchu (TW)

(72) Inventors: Tsui-Mei Chen, Hsinchu (TW); Tsung-Jen Liao, Zhubei (TW); Li-Huan Chu, Hsinchu (TW); Pei-Haw Tsao, Taichung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/167,267

(22) Filed: Feb. 4, 2021

(65) Prior Publication Data

US 2021/0343667 A1 Nov. 4, 2021

Related U.S. Application Data

(60) Provisional application No. 63/017,157, filed on Apr. 29, 2020.

(51) Int. Cl.
*H01L 23/00* (2006.01)

(52) U.S. Cl.
CPC .............. *H01L 24/05* (2013.01); *H01L 24/03* (2013.01); *H01L 2224/0401* (2013.01)

(58) Field of Classification Search
CPC . H01L 24/05; H01L 24/03; H01L 2224/0401; H01L 1/76838; H01L 21/76883; H01L 21/76885; H01L 24/02; H01L 24/13; H01L 2224/0236; H01L 2224/024; H01L 2224/0346

See application file for complete search history.

(56) References Cited

U.S. PATENT DOCUMENTS

| | | | |
|---|---|---|---|
| 6,251,694 B1* | 6/2001 | Liu | H01L 22/32 257/E23.021 |
| 6,376,362 B1* | 4/2002 | Matsumoto | H01L 23/53238 438/642 |
| 9,666,530 B1* | 5/2017 | Chen | H01L 21/6835 |
| 2006/0267008 A1* | 11/2006 | Tsao | H01L 24/48 257/48 |
| 2013/0043598 A1* | 2/2013 | Chen | H01L 23/291 257/774 |
| 2020/0135676 A1* | 4/2020 | Kalnitsky | H01L 21/56 |
| 2021/0193601 A1* | 6/2021 | Jensen | H01L 24/03 |

FOREIGN PATENT DOCUMENTS

| | | |
|---|---|---|
| TW | 201919174 A | 5/2019 |
| TW | 201926496 A | 7/2019 |

\* cited by examiner

*Primary Examiner* — Douglas W Owens
(74) *Attorney, Agent, or Firm* — Marbury Law Group, PLLC (57) ABSTRACT

An integrated fan-out structure on a semiconductor die, method of making the same and method of testing the semiconductor die are disclosed. The semiconductor die includes a bond pad and a hole formed in the bond pad, a passivation layer formed over a portion of the bond pad, and a protective layer formed over the hole in the bond pad.

20 Claims, 6 Drawing Sheets

INTEGRATED FAN-OUT STRUCTURES AND METHODS FOR FORMING THE SAME

RELATED APPLICATIONS

This application claims priority to U.S. Provisional Patent Application No. 63/017,157 entitled "Integrated Fan-Out Structures and Methods for Forming the Same" filed on Apr. 29, 2020, the entire contents of which are hereby incorporated by reference for all purposes.

BACKGROUND

As semiconductor fabrication technologies and techniques evolve, semiconductor chips/dies sizes are decreasing. Moreover, the number and complexity of functions that are integrated into the semiconductor dies as well as transistor density of semiconductor chips/dies are increasing. As a result, the semiconductor dies have increasingly greater numbers of I/O pads formed into smaller areas, and the density of the I/O pads rises quickly over time. As a result, the packaging of the semiconductor dies becomes more difficult, which adversely affects the yield of the packaging.

Typically, dies (chips) are sawed from wafers before they are packaged, and only "known good dies" are packaged. An advantageous feature of this packaging technology is the possibility of forming integrated fan-out (InFO) packages. In InFO packaging, the I/O pads on a die may be redistributed to a greater area than the die, and hence the number of I/O pads formed on the surfaces of the dies may be increased.

In conventional integrated circuit manufacturing technology, testing typically is a final step for detecting defects that may have been generated during the integrated circuit fabrication process. In conventional methods, semiconductor dies are often inspected and tested after formation of the conductive (e.g. copper) pillars just prior to packaging. As a consequence of testing semiconductor dies late in the fabrication process, even if such testing might detect defects and even determine the cause of the defect, corrective and mitigating measures may not be deployed to cure such defects as the testing does not occur until well after the fabrication process is nearly complete.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As discussed above, in integrated circuit manufacturing technology, testing is typically a final step for detecting defects in the chip and/or circuit generated during the integrated circuit fabrication process. In some methods, semiconductor dies are inspected after formation of the conductive (e.g. copper) pillars just prior to packaging. In such methods, a bond pad may be formed. A passivation layer may be deposited over the bond pad. The passivation layer may be etched to form an opening over the bond pad at a later stage in the fabrication process. An under bump metallization (UBM) layer may be deposited over the bond pad/passivation layer structure within the opening in the passivation layer. A copper pillar may be formed over the bond pad. A solder bump may be formed over the copper pillar to provide a connection node for a chip probe. The solder bump may be removed by top die grinding after the chip probe is complete. The solder may act as a sacrificial layer after the chip probe.

Chip probe testing may determine the root cause(s) of defects to a fabricated chip and/or circuit. However, by delaying the testing until late or at the end of the fabrication process, even if the cause of defects may be determined, corrective or mitigating measures may not be deployed in a timely manner.

In the various embodiments disclosed herein, circuit probe testing may be performed among the wafers to verify that each semiconductor die/chip meets product specifications at a much earlier stage in the fabrication process. In the various embodiments, finished dies may be inspected after formation of the bond pads, but well prior to the packaging process. Thus, the inspection of the semiconductor dies may be made days earlier in the fabrication process. In the event the cause of the defect is determined during the testing process, corrective or mitigating measures may be deployed to cure the defects for subsequently fabricated semiconductor dies before the packaging process may be initiated. The various embodiments disclosed herein may allow a fabricator to obtain chip probing days at a much earlier time at no extra financial or opportunity cost. Moreover, the cost of the additional formation of the solder bumps on the copper pillar for chip probing that are subsequently ground off may be avoided.

Figure 1A:
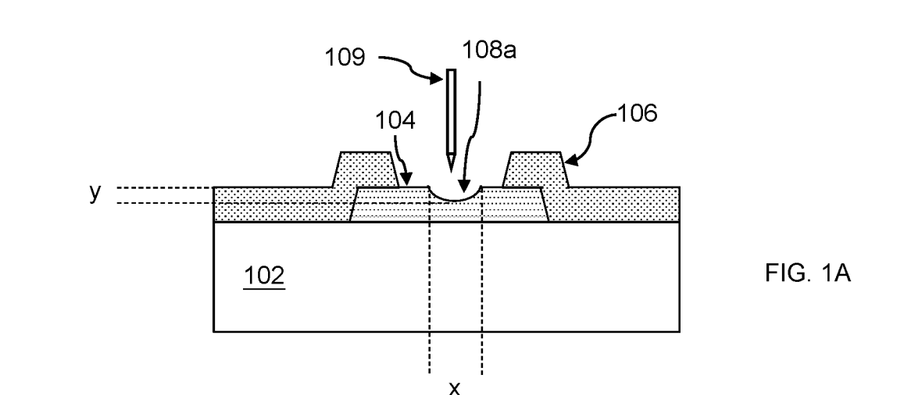
FIG. 1A is a vertical cross-sectional view illustrating a step of forming a hole in a contact pad of a semiconductor die in a method for fabricating a semiconductor device in accordance with some embodiments.

Referring to FIG. 1A, a semiconductor die 102 having circuit elements formed thereon (not shown) may be provided. The semiconductor die 102 may include a bond pad 104 and a passivation layer 106. The passivation layer 106 may protect the top surface of the semiconductor die 102 and a portion of the bond pad 104. The bond pad 104 may be made of aluminum, copper or an alloy thereof. The bond pad 104 may be formed by any suitable method. For example, a layer of bond pad material may be deposited by physical vapor deposition (PVD), such as a sputtering deposition using a sputtering target made of aluminum, copper or an alloy thereof. Alternatively, the bond pad material may be deposited by chemical vapor deposition (CVD), atomic layer deposition (ALD) or any epitaxial deposition method. After depositing the bond pad materials, the deposited layer of bond pad material may be patterned by a photolithography and etching process.

The passivation layer 106 may be made of silicon oxide, silicon oxynitride, and/or a low-k dielectric material such as organosilicate glass. The passivation layer 106 may be formed by depositing a photoresist layer (not show) and patterning the photoresist layer such that a central portion of the bond pad 104 may be masked. The passivation layer 106 may be deposited over the surface of the semiconductor die 102 and the bond pad 104. Next, the photoresist layer may be removed by a liftoff process, leaving the central portion of the bond had 104 exposed. Alternatively, the passivation layer 106 may be deposited over the surface of the semiconductor die 102 and the entire bond pad 104. Next, a photoresist layer (not shown) may be deposited over the passivation layer 106 and patterned such that a portion of the passivation layer 106 over a central portion of the bond pad 104 is exposed. Then, the exposed portion of the passivation layer 106 over the central portion of the bond pad 104 may be removed by, for example, an etch process. Finally, the photoresist layer may be removed, such as by ashing or by dissolving in the solvent.

Next, a chip probe 109 may be pressed against the exposed surface of the bond pad 104. The application of the chip probe 109 to the exposed surface of the bond pad 104 may form the hole 108a in the exposed surface of the bond pad 104. The hole 108a need not penetrate the entire thickness of the bond pad 104. The depth of the hole 108a may be sufficiently deep to accommodate a tip portion of the chip probe 109. During the chip fabrication process (and well before the packaging process) a chip probe 109 may be used in testing to determine whether the chip being fabricated is acceptable and meets product specifications. In instances in which the chip being fabricated does not meet product specification, the chip may be discarded. Thus, only known good chips or dies may be passed onto to further processing operations. In various embodiments, the chip probe 109 may have a diameter "x" in the range of 0.01 µm to 50 µm, such as 1 µm to 25 µm. although greater or lesser diameters may be used. Thus, in various embodiments, the hole 108a may have a diameter in the range of 0.01 µm to 50 µm, such as 1 µm to 25 µm. although greater or lesser diameters may be used. In various embodiments, the hole 108a may have a depth "y" in the range of 0.01 µm to 5 µm, such as 1 µm to 3 µm. although greater or lesser depths may be used. After formation of the hole 108a in the bond pad 104, i.e. upon forming the hole 108a with the chip probe 109, the semiconductor die 102 may be tested with the chip probe 109 for potential defects.

Figure 1B:
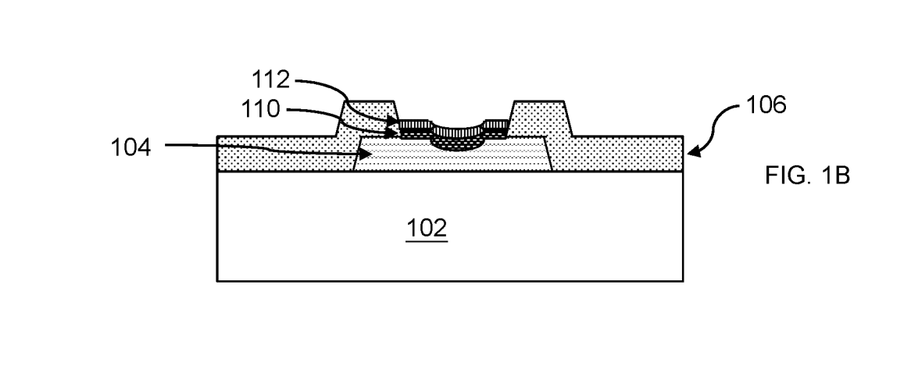
FIG. 1B is a vertical cross-sectional view illustrating a step of depositing a seed layer and a protective layer in the hole in a method for fabricating a semiconductor device in accordance with some embodiments.

Referring to FIG. 1B, a seed layer 110 may be deposited over the surface of the bond pad 104 that may be exposed through the passivation layer 106. The seed layer 110 is a layer which aids in the formation of subsequent layers. In various embodiments, an electroless plating process may be used to deposit the seed layer 110. In the electroless plating process, the seed material may be plated using a chemical reaction without the application of an external electrical current (i.e., electroless). The electroless plating process creates a conformal layer of seed material that follows the contours of the bond pad 104 and hole 108a. In various embodiments, the seed layer 110 may comprise nickel (Ni). Other suitable materials for the seed layer 110 are within the contemplated scope of disclosure. The seed layer 110 may have a thickness in the range of 0.01 µm to 5 µm, such as 1 µm to 3 µm, although greater or lesser thicknesses may be used.

Next a protective layer 112 may be grown by deposition using the seed layer 110 to aid in growth in the area exposed in the passivation layer 106. The protective layer 112 may be deposited to prevent the seed layer 110 from oxidizing. In various embodiments, the protective layer 112 comprises gold (Au). However, other suitable materials within the contemplated scope of disclosure may be used. The protective layer may have a thickness of in the range of 0.01 µm to 0.2 µm, although greater or lesser thicknesses may be used. The protective layer 112 may be formed by any suitable method. For example, in various embodiments, the protective layer 112 may be formed by immersion plating the protective layer 112 on the seed layer 110. In this manner, the protective layer 112 may form a conformal layer that follows the contours of the bond pad 104 with formed hole 108a and seed layer 110. Thus, the contours of the hole 108a (depression) may be present in the final product. In instances in which the semiconductor die 102 is not tested with a chip probe 109, the bond pad 104, seed layer 110, and protective layer 112 may be substantially planar as no hole 108a may be formed in the bond pad 104

Figure 1C:
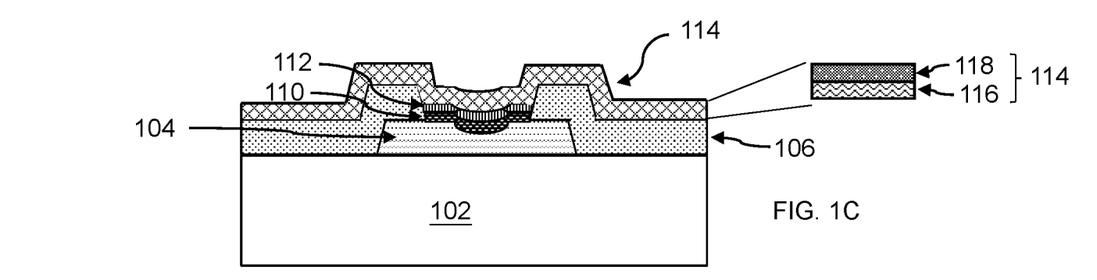
FIG. 1C is a vertical cross-sectional view illustrating a step of depositing an under bump metallization (UMB) layer over the surface of the intermediate structure illustrated in FIG. 1B in a method for fabricating a semiconductor device in accordance with some embodiments.

Referring to FIG. 1C, a first under bump metallization (UBM) layer 114 may be conformally deposited over the surface of passivation layer 106 and the protective layer 112. In some embodiments, the first UBM layer 114 may comprise multiple layers. For example, in various embodiments, the first UBM layer 114 may comprises a first diffusion barrier layer 116 and a second seed layer 118. The second seed layer 118 may aid in the formation of the conductive pillar 120, discussed in more detail below. In various embodiments, the first diffusion barrier layer 116 may comprise Ti, TiN or Ta. Other suitable materials are within the contemplated scope of disclosure. In various embodiments, the second seed layer 118 may comprise Cu or a Cu alloy. However, other suitable materials within the contemplated scope of disclosure may be used. The first diffusion barrier layer 116 may have a thickness in the range of 10-50 nm, such as 15 nm to 40 nm, although greater or lesser thicknesses may be used. The second seed layer 118 may have a thickness in the range of 10-150 nm, such as 15 nm to 100 nm, although greater or lesser thicknesses may be used.

Figure 1D:
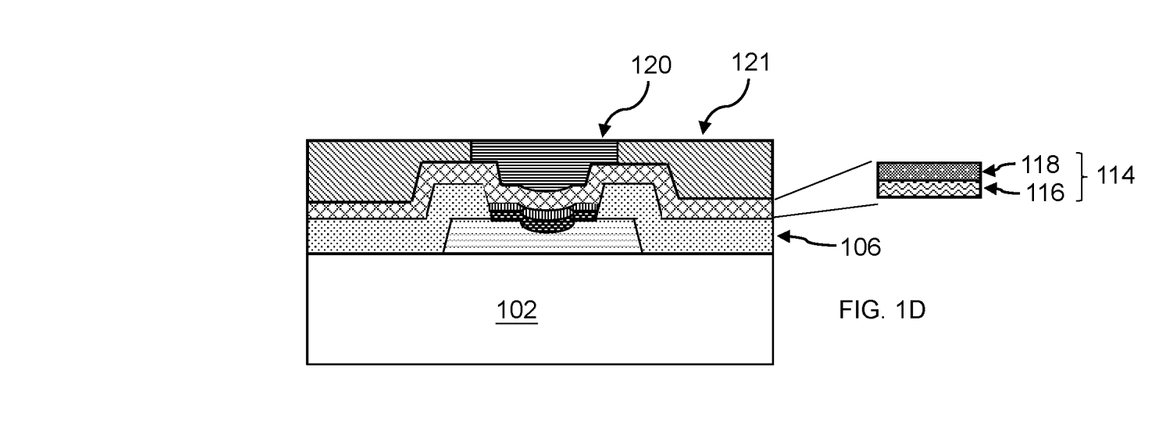
FIG. 1D is a vertical cross-sectional view illustrating a step of depositing and patterning a photoresist layer and depositing a copper pillar in the patterned photoresist layer over the under bump metallization layer in a method for fabricating a semiconductor device in accordance with some embodiments.

Referring to FIG. 1D, the first UBM layer 114 may be covered with a photoresist layer 121. The photoresist layer 121 may then be patterned to provide an opening (not shown) in the photoresist layer 121 exposing a portion of the first UBM layer 114 located above the seed layer 110 and the protective layer 112. In various embodiments, the upper surface of the first UBM layer 114 over the seed layer 110 and protective layer 112 may have a concave portion due to the underlying seed layer 110 and protective layer 112 filling the hole 108a. Next, copper may be deposited in the opening in the photoresist layer 121 over the UBM layer 114 to form a conductive pillar 120. Other suitable materials within the contemplated scope of disclosure may be deposited to form the conductive pillar 120.

Figure 1E:
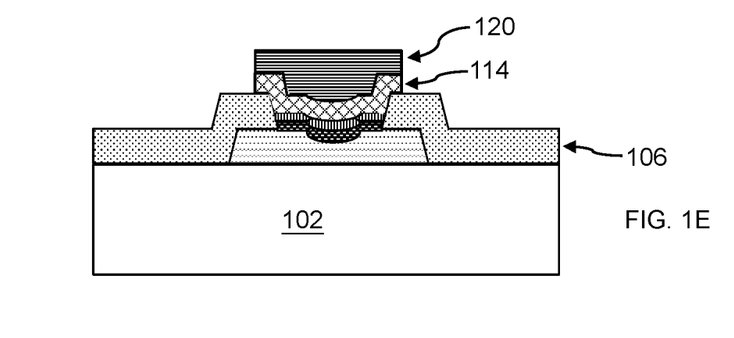
FIG. 1E is a vertical cross-sectional view illustrating a step of patterning the under bump metallization layer and removing the photoresist layer in a method for fabricating a semiconductor device in accordance with some embodiments.

Referring to FIG. 1E, the photoresist layer 121 may be removed, for example, by ashing. Using the conductive pillar 120 as a mask, the exposed portion of the first UBM layer 114 may be removed. The exposed UBM material of the UBM layer 114 may be removed, for example, by selective etching, such as by reactive ion etching.

In an alternative embodiment, a conductive pillar 120 may be deposited over the structure formed in FIG. 1C. In this manner, the depression formed in the first UBM layer 114 resulting over hole 108a may be filled with the conductive pillar 120 material. A photoresist layer may be formed over the conductive pillar 120 material to mask a portion of the conductive pillar 120 material overlying the bond pad 104. The exposed portions of the conductive pillar 120 material may be removed (e.g., through an etch process). In the various embodiments, the bottom surface of the conductive pillar 120 may have a convex surface that follows the contours of the hole 108 and overlying layers (i.e., seed layer 110, protective layer 112 and UBM layer 114.

Figure 1F:
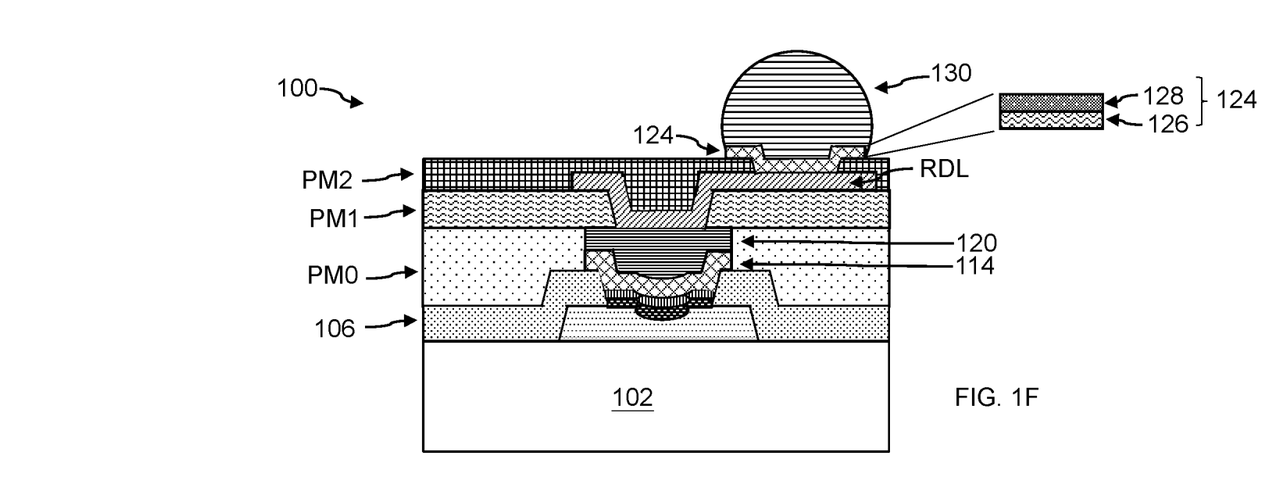
FIG. 1F is a vertical cross-sectional view illustrating a step of deposing a series of polymer layers, a redistribution layer and a solder ball over the intermediate structure illustrated in FIG. 1E in a method for fabricating a semiconductor device in accordance with some embodiments.

Referring to FIG. 1F, a first polymer layer PM0 may be formed over the passivation layer 106 and the conductive pillar 120. Next, a chemical-mechanical polishing (CMP) step may be performed to planarize the upper surface of the device (i.e., conductive pillar 120) and the first polymer layer PM0 so as to remove excess portions of the first polymer layer PM0 and to expose the top surface of the conductive pillar 120. The top surface of the first polymer layer PM0 and the tope surface of the conductive pillar 120 may be formed to be co-planar.

Next, a second polymer layer PM1 may be formed over the first polymer layer PM0. A photoresist layer (not shown) may be deposited over the second polymer layer PM1. The photoresist layer (not shown) may be patterned using photolithography to create a mask over second polymer layer PM1. The second polymer layer PM1 may be etched to expose a portion of the conductive pillar 120 in an opening of the second polymer layer PM1.

Next, a redistribution layer RDL may be deposited over the second polymer layer PM1 and in the etched opening in the second polymer layer PM1 such that the redistribution layer RDL may be in electrical contact with the conductive pillar 120. As its name suggests, a redistribution layer is an extra metal layer on a chip that re-distributes the input-output pads of an integrated circuit such that an electrical connection may be made in another location of the die. In this manner, the RDL may provide more convenient access to the input-output pads. Another example of the use for a redistribution layer RDL may be to spreading (i.e., distribute) the contact points around the die so that solder balls may be applied, and the thermal stress of mounting may be spread (i.e., distributed) throughout the die. The redistribution layer RDL may be patterned such that undesired RDL material may be removed from the top surface of the second polymer layer PM1, leaving only desired traces on the surface of the second polymer layer PM1.

Next, a third polymer layer PM2 may be deposited over the surface of the second polymer layer PM1 and the redistribution layer RDL. A photoresist layer (not shown) may be deposited over the third polymer layer PM2. The photoresist layer (not shown) may be patterned using photolithography to create a mask over third polymer layer PM2. The third polymer layer PM2 may be etched to expose a portion of the redistribution layer RDL in an opening of the third polymer layer PM2.

A second UBM layer 124 may be deposited in the hole in the third polymer layer PM2, thereby making electrical contact with the redistribution layer RDL. Thus, the integrated fan-out structure 100 may include two UBM layers 114, 124. As with the first UBM layer 114, the second UBM layer 124 may include a second diffusion barrier layer 126 and a third seed layer 128. The third seed layer 128 may aid in the formation and adhesion of the solder ball 130. In various embodiments, the second diffusion barrier layer 126 may be made of Ti, TiN or Ta. Other suitable materials are within the contemplated scope of disclosure. The second diffusion barrier layer 126 may have a thickness in the range of 10-50 nm, such as 20 nm-40 nm, although lesser or greater thicknesses may be used. The third seed layer 128 may be made of copper. Other suitable materials are within the contemplated scope of disclosure. The third seed layer 128 may have a thickness in the range of 10-300 nm, such as 20-200 nm, although greater or lesser thicknesses may be used. As illustrated, the second UBM layer 124 may be located at a different vertical distance from the top surface of the semiconductor die 102 than the first UBM layer 114 due to the additional process steps and layers formed therebetween. Next, a solder ball 130 may deposited on the second UBM layer 124, completing the integrated fan-out structure 100. As illustrated in FIG. 1F, the solder ball 130 may be laterally displaced from the conductive pillar 120. That is, in contrast to the conventional integrated fan-out structure, the solder ball 130 may not be located directly above and in contact with the conductive pillar 120. The solder ball 130 may be offset from the conductive pillar 120.

The polymer layers PM0, PM1, PM2 may be made of the same or different polymers. Example polymers include, but are not limited to, polybenzoxazole (PBO), polyimide (PI), benzocyclobutene (BCB) and combinations thereof. Other suitable polymer materials are within the contemplated scope of disclosure.

Figure 2:
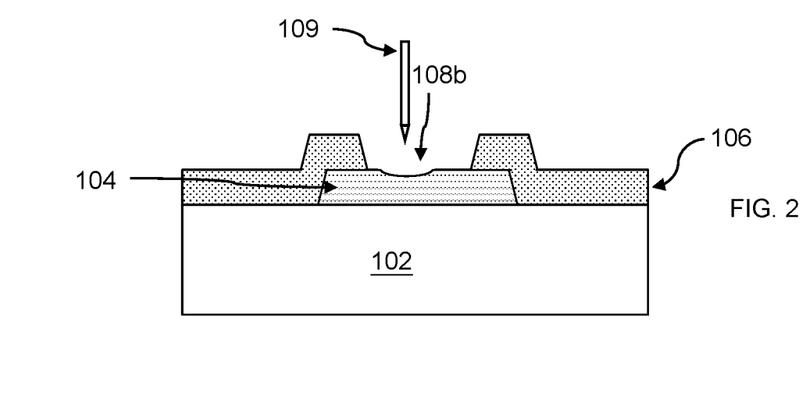
FIG. 2 is a vertical cross-sectional view illustrating a step of depositing a seed layer and a protective layer in an off center hole in a method for fabricating a semiconductor device in accordance with still other embodiments.

Referring to FIG. 2, an embodiment is provided in which the hole 108b in the bond pad 104 is located off center of the bond pad 104. That is, the hole 108b in the bond pad 104 is laterally offset from the center of the bond pad 104. As discussed above, prior to the packaging process, circuit probe testing may be performed among the wafers to verify that each die meets product specifications. To ensure that the chip probes 109 are correctly aligned, probe mark inspections may be performed to determine whether shifts in the location of a probe mark (e.g. holes 108a, 108b) may occur. Probe mark shifts involve shifting of a probe mark on a bond pad 104, which indicates that the probe mark had exceeded the bond pad's safe scope. The current embodiment reflects the effect of a probe shift on the location of the hole 108b (i.e. probe mark) in the bond pad 104.

Figure 3:
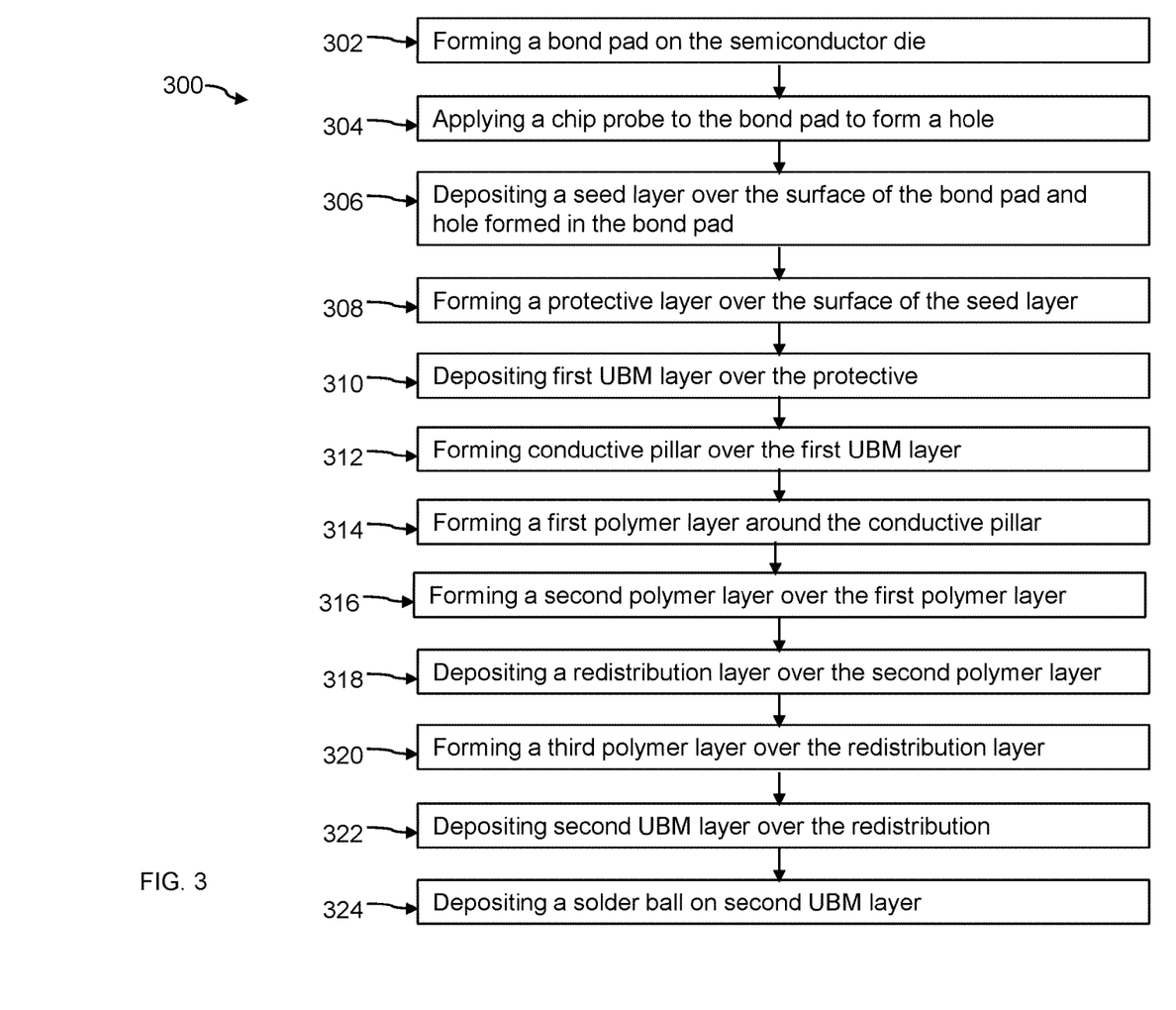
FIG. 3 is a flowchart illustrating a method of making a semiconductor device in accordance with various embodiments of the present disclosure.

FIG. 3 is a flowchart illustrating general method 300 of an integrated fan-out structure 100 on a semiconductor die 102 according to various embodiments. Referring to step 302, the method includes forming a bond pad 104 on the semiconductor die 102. Referring to step 304, the method includes applying a chip probe 109 to the bond pad 104 forming a hole 108a, 108b in the bond pad 104. Consequently, the dimensions of the chip probe 109 may impact the dimensions of the formed hole 108a, 108b. Referring to step 306, the seed layer 110 may be deposited over the surface of the bond pad 104 and hole 108a, 108b formed in the bond pad. Referring to step 308, a protective layer 112 may be formed over the seed layer 110. Referring to step 310, a first UBM layer 114 may be formed over the surface of the seed layer 112 and passivation layer 106. Referring to step 312, a conductive pillar 120 may be formed over the first UBM layer 114. Referring to step 314, a first polymer layer PM0 may be formed around the conductive pillar 120. Referring to step 316, a second polymer layer PM1 may be formed over the first polymer layer PM0. The second polymer layer PM1 may be etched to form an opening to expose a top surface of the conductive pillar 120. Referring to step 318, a redistribution layer (RDL) may be formed over the second polymer layer PM1 and in the opening in the second polymer layer PM1 to contact a top surface of the conductive pillar 120. Referring to step 320, a third polymer layer PM2 may be formed over the RDL. The third polymer layer PM2 may also contact portions of the second polymer layer PM1. The third polymer layer PM2 may be etched to form an opening that exposes a top surface of the RDL. Referring to step 322, a second UBM layer 124 may be formed over the third polymer layer PM2 and in the etch opening to contact the top surface of the RDL. Referring to step 324, a solder ball 130 may be deposited over the second UBM layer.

Figure 4:
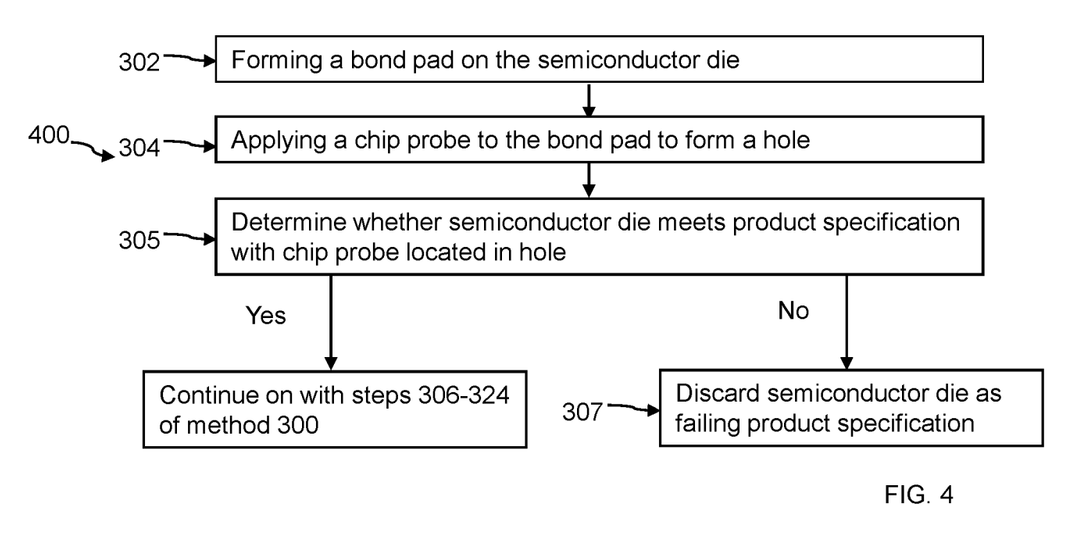
FIG. 4 is a flowchart illustrating a method of testing a semiconductor device in accordance with various embodiments of the present disclosure.

FIG. 4 is a flowchart illustrating general method 400 of method of testing a semiconductor die 102 according to various embodiments. As discussed above with respect to method 300, referring to step 302, the method includes forming a bond pad 104 on the semiconductor die 102. Referring to step 304, the method includes applying a chip probe 109 to the bond pad 104 forming a hole 108a, 108b in the bond pad 104. Referring to step 305, the method includes locating a chip probe 109 in the hole 108a, 108b in the bond pad 104 and determining whether the semiconductor die 102 meets product specifications. In response to determining that the semiconductor die 102 meets the product specification (i.e., determination 305=yes), the semiconductor die 102 may be designated as an acceptable semiconductor die 102 and the remaining processing steps 306-324 described above with respect to method 300 in FIG. 3 may be performed. In response to determining that the semiconductor die 102 does not meet the product specification (i.e., determination 305=no), the semiconductor die 102 may be discarded as unacceptable.

Generally, the structures and methods of the present disclosure may be used to form an integrated fan-out structure 100 on a semiconductor die 102 and to test semiconductor dies 102. As discussed above, in conventional integrated circuit manufacturing technology, testing typically is a final step for detecting defects that may have been generated during the integrated circuit fabrication process. In conventional methods, semiconductor dies 102 are inspected after formation of the conductive (e.g. copper) pillar 120 and just prior to packaging.

However, testing may determine the root cause(s) of these defects. By delaying the testing until late or at the end of the fabrication process, even if the cause of defects may be determined, corrective or mitigating measures may not be deployed. In the various embodiments disclosed herein, circuit probe testing may be performed among the wafers to verify that each semiconductor die/chip 102 meets product specifications at a much earlier stage in the fabrication process. In the various embodiments, finished dies 102 could be inspected after formation of the bond pads 104, but well prior to the packaging process. Thus, the inspection of the semiconductor dies 102 may be made days earlier in the fabrication process. In the event the cause of the defect is determined during the testing process, corrective or mitigating measures may be deployed to cure the defects for subsequently fabricated semiconductor dies 102 before the packaging process may be initiated.

Referring to all drawings and according to various embodiments of the present disclosure, a semiconductor die 102 is provided. The semiconductor die 102 may include a bond pad 104 and a hole 108a, 108b formed in the bond pad 104. The embodiment semiconductor die 102 may further include a passivation layer 106 formed over a portion of the bond pad 104. The embodiment semiconductor die 102 may further include a protective layer 112 formed over the hole 108a, 108b in the bond pad 104. In an embodiment, a semiconductor die 102 may also include a first seed layer 110 formed over the hole 108a, 108b in the bond pad 104, wherein a top surface of the first seed layer 110 is contoured over the hole 108a, 108b in the bond pad 104. In an embodiment, the hole 108a, 108b in the bond pad 104 may be laterally offset from a center of the bond pad 104. In an embodiment semiconductor die 102, the first seed layer 110 may comprise electro-less nickel plating and may be formed with a thickness in a range of 0.01 µm to 5 µm, and the protective layer 112 may comprise gold plating and may be formed with thickness in a range of 0.01 µm to 0.2 µm. In an embodiment semiconductor die 102, a top surface of the protective layer 112 is contoured over the hole 108a, 108b in the bond pad 104. In a further embodiment, a semiconductor die 102 may include a first under bump metallization layer 114 covering the protective layer 112 and a top surface of the first under bump metallization layer 114 comprises a concave portion located over the hole 108a, 108b in the bond pad 104. In another embodiment, a semiconductor die 102 may include a first under bump metallization layer 114 covering the protective layer 112 and a second under bump metallization layer 124, wherein the first under bump metallization layer 114 and second under bump metallization layer 124 are located at different vertical distances from a top surface of the semiconductor die 102. In another embodiment, the semiconductor die 102 further includes a conductive pillar 120 located over the first under bump metallization layers 114; and a solder ball 130 located over a second under bump metallization layers 1242, wherein the solder ball 130 is laterally displaced from the conductive pillar 120.

Another embodiment semiconductor die 102 is provided. The embodiment semiconductor die 102 may include a bond pad 104 and a hole 108a, 108b formed in the bond pad 104, wherein the hole is formed with a diameter in a range of 0.01-50 μm and a depth of 0.01-5 μm. The embodiment semiconductor die 102 may further include a passivation layer 106 formed over a portion of the bond pad 104. The embodiment semiconductor die 102 may further include a protective layer 112 formed over the hole 108a, 108b in the bond pad 104.

An embodiment is drawn to a method 300 of making an integrated fan-out structure 100 on a semiconductor die 102 including forming a bond pad 104 on the semiconductor die 102, depositing a passivation layer 108 over the bond pad 104 and forming a hole 108a, 108b in the bond pad 104 by applying pressure with a chip probe 109.

In an embodiment method, the hole 108a, 108b is formed with a diameter in a range of 0.01-50 μm and a depth of 0.01-5 μm. The embodiment method may further include the step of testing the semiconductor die 102 to determine whether the semiconductor die 102 meets product specifications with the chip probe 109 contacting the bond pad 104 in the hole 108a, 108b formed in the bond pad 104. The embodiment method may further include the step of forming a first seed layer 110 in the hole 108a. 108b in response to the semiconductor die 102 meeting product specifications. The embodiment method further including the step of forming a protective layer 112 over the first seed layer 110. The embodiment method, wherein forming the first seed layer 110 comprises electroless plating Ni over the bond pad 104; and forming the protective layer 112 comprises immersion plating Au over the first seed layer 110. The embodiment method further including the steps of: forming a first under bump metallization layer 114 over the protective layer 112; forming a conductive pillar 120 over the first under bump metallization layer 114; forming a redistribution layer over the first under bump metallization layer 114; forming a second under bump metallization layer 124 over the redistribution layer; and forming a solder ball 130 on the second under bump metallization layer 124. The embodiment method, wherein the solder ball 130 is formed laterally displaced from the conductive pillar 120. The embodiment method, wherein the second under bump metallization layer 124 is formed at a different vertical distance then the first under bump metallization layer 114 from a top surface of the semiconductor die 102. The embodiment method, wherein forming the first under bump metallization layer 114 comprises forming a first diffusion barrier layer 116 and a second seed layer 118; and forming the second under bump metallization layer 124 comprises forming a second diffusion barrier layer 126 and a third seed layer 128.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die comprising:
    a bond pad, the bond pad comprising a hole formed in the bond pad;
    a passivation layer formed over a portion of the bond pad;
    a protective layer formed over the hole in the bond pad; and
    a first seed layer formed over the hole in the bond pad.

2. The semiconductor die of claim 1, wherein a top surface of the first seed layer is contoured over the hole in the bond pad.

3. The semiconductor die of claim 1, wherein the hole in the bond pad is laterally offset from a center of the bond pad.

4. The semiconductor die of claim 1, wherein:
    the first seed layer comprises electro-less nickel plating and is formed with a thickness in a range of 0.01 μm to 5 μm; and
    the protective layer comprises gold plating and is formed with thickness in a range of 0.01 μm to 0.2 μm.

5. The semiconductor die of claim 1, wherein a top surface of the protective layer is contoured over the hole in the bond pad.

6. The semiconductor die of claim 5, further comprising a first under bump metallization layer covering the protective layer and a top surface of the first under bump metallization layer comprises a concave portion located over the hole in the bond pad.

7. The semiconductor die of claim 1, further comprising a first under bump metallization layer covering the protective layer and a second under bump metallization layer, wherein the first under bump metallization layer and second under bump metallization layer are located at different vertical distances from a top surface of the semiconductor die.

8. The semiconductor die of claim 7, further comprising:
    a conductive pillar located over the first under bump metallization layers; and
    a solder ball located over a second under bump metallization layers, wherein the solder ball is laterally displaced from the conductive pillar.

9. A semiconductor die comprising:
    a bond pad, the bond pad comprising a hole formed in the bond pad wherein the hole is formed with a diameter in a range of 0.01-50 μm and a depth of 0.01-5 μm;
    a passivation layer formed over a portion of the bond pad;
    a protective layer formed over the hole in the bond pad; and
    a first seed layer formed over the hole in the bond pad, wherein a top surface of the first seed layer is contoured over the hole in the bond pad.

10. The semiconductor die of claim 9, further comprising a first under bump metallization layer covering the protective layer, wherein the first under bump metallization layer comprises a first diffusion barrier layer and a second seed layer.

11. An electrical connection structure comprising:
    a bond pad including a first recessed portion;
    an underbump metallization (UBM) layer on the bond pad and including a first protruding portion substantially aligned with the first recessed portion of the bond pad; and
    a conductive pillar on the UBM layer.

12. The electrical connection structure of claim 11, wherein the first recessed portion of the bond pad has a diameter in a range from 0.01 μm to 50 μm and a depth in a range from 0.01 μm to 5 μm.

13. The electrical connection structure of claim 11, wherein the first recessed portion of the bond pad is misaligned with a center of the bond pad.

14. The electrical connection structure of claim 11, wherein the UBM layer comprises a second recessed portion substantially aligned with the first recessed portion of the bond pad and with the first protruding portion of the UBM layer.

15. The electrical connection structure of claim 14, wherein the conductive pillar comprises a second protruding portion substantially aligned with the first recessed portion of the bond pad, with the first protruding portion of the UBM layer and with the second recessed portion of the UBM layer.

16. The electrical connection structure of claim 15, wherein the second protruding portion of the conductive pillar protrudes into the second recessed portion of the UBM layer.

17. The electrical connection structure of claim 16, further comprising:

a first seed layer on the bond pad and including a third protruding portion protruding into the first recessed portion of the bond pad.

18. The electrical connection structure of claim 17, wherein the first seed layer further comprises a third recessed portion substantially aligned with the third protruding portion of the first seed layer.

19. The electrical connection structure of claim 11, wherein the conductive pillar comprises a substantially uniform upper surface substantially aligned with the first recessed portion of the bond pad.

20. The electrical connection structure of claim 19, further comprising:

a metal redistribution layer contacting the substantially uniform upper surface of the conductive pillar.

* * * * *